(12) United States Patent
Chen et al.

(10) Patent No.: US 9,031,810 B2
(45) Date of Patent: May 12, 2015

(54) METHODS AND SYSTEMS OF OBJECT BASED METROLOGY FOR ADVANCED WAFER SURFACE NANOTOPOGRAPHY

(76) Inventors: Haiguang Chen, Mountain View, CA (US); Jaydeep K. Sinha, Livermore, CA (US); Sergey Kamensky, Campbell, CA (US)

( * ) Notice: Subject to any disclaimer, the term of this patent is extended or adjusted under 35 U.S.C. 154(b) by 865 days.

(21) Appl. No.: 13/170,094

(22) Filed: Jun. 27, 2011

(65) Prior Publication Data

US 2012/0179419 A1    Jul. 12, 2012

Related U.S. Application Data

(60) Provisional application No. 61/431,556, filed on Jan. 11, 2011.

(51) Int. Cl.
  *G06F 15/00* (2006.01)
  *H01L 21/66* (2006.01)

(52) U.S. Cl.
  CPC ............... *H01L 22/12* (2013.01); *H01L 22/20* (2013.01); *H01L 2924/0002* (2013.01)

(58) Field of Classification Search
  USPC ............... 702/40, 85, 108; 356/237.1, 237.2, 356/237.5, 237.6; 382/145
  See application file for complete search history.

(56) References Cited

U.S. PATENT DOCUMENTS

| | | |
|---|---|---|
| 2004/0188609 A1* | 9/2004 | Miyai et al. ............... 250/310 |
| 2004/0206891 A1 | 10/2004 | Ma |
| 2005/0033550 A1 | 2/2005 | Macaluso |
| 2007/0035322 A1 | 2/2007 | Kang |
| 2009/0002688 A1 | 1/2009 | Soeda |
| 2011/0172982 A1 | 7/2011 | Veeraraghavan |
| 2012/0177282 A1* | 7/2012 | Chen et al. ............... 382/145 |

FOREIGN PATENT DOCUMENTS

WO    WO2010025334 A1    3/2010

OTHER PUBLICATIONS

K. Freischlad, S. Tang, and J. Grenfell, "Interferometry for wafer dimensional metrology", Proceedings of SPIE, 6672, 1 (2007)).

* cited by examiner

*Primary Examiner* — John Breene
*Assistant Examiner* — Hien Vo
(74) *Attorney, Agent, or Firm* — Deborah Wenocur

(57) ABSTRACT

A system and method for enhanced and expanded localized geometry characterization. Objects of interest are enhanced, detected, and classified according to user-defined parameters, and this enables enhanced contrast and more accurate feature detection, as well as more accurately defined feature object regions for feature geometry measurement and characterization.

13 Claims, 12 Drawing Sheets

METHODS AND SYSTEMS OF OBJECT BASED METROLOGY FOR ADVANCED WAFER SURFACE NANOTOPOGRAPHY

CROSS REFERENCE TO RELATED APPLICATION

This application is related to U.S. Provisional application No. 61/431,556, filed Jan. 11, 2011, and claims priority thereto.

FIELD OF THE INVENTION

This invention relates to metrology of semiconductor wafers, and in particular to methods for improving localized feature metrology.

BACKGROUND

As integrated circuits become faster and denser, requirements for control of topographical features such as planarity, shape, and thickness become increasingly stringent. The necessity for verifying that a given wafer is sufficiently planar and within specifications, i.e. in qualifying and selecting wafers even before processing begins or during processing, is becoming ever greater. A critical component in the characterization of wafers is the wafer topography, sometimes termed substrate geometry.

Wafer topography (i.e., substrate geometry) can be described according to traditional parameters such as shape, thickness/flatness, and nanotopography (NT). These parameters have different characteristics, which are defined in detail in SEMI standards M1, Appendices 1 and 2. SEMI standards M1 is hereby incorporated by reference in its entirety. Note that shape and flatness tend to be low frequency component descriptions of a wafer. Nanotopography is defined in (SEMI standards M41) as the non-planar deviation of the whole front wafer surface within a spatial wavelength range of app. 0.2 to 20 mm and within the fixed quality area. NT features may occur as point, line, or area features. Examples of point features are dimples; examples of area features are epi pins or crowns, bumps on notches or lasermarks; examples of line features are: saw marks from slicing, scratches, slip lines, dopant striation or other process signatures. The individual front/back surface nanotopography of a wafer substrate is typically obtained from the front/back topography by applying high pass filtering schemes such as Double Gaussian (DG) filtering to the topography data, which suppresses the low frequency components of the wafer topography. The substrate NT features are seen to affect the lithography process, for example by contributing to defocus and overlay errors. Characterization and quantification of higher order components of shape and more localized shape features are described in PCT publication No. WO 2010/025334, U.S. Provisional application No. 61/092,720, and U.S. application Ser. No. 12/778,013 all of which are incorporated by reference in their entireties.

As integrated circuit technology progresses to smaller nodes, i.e., as design rules get smaller, localized topography qualification of both wafer front and back surfaces is gaining interest. These localized, higher frequency topographic features in general cannot be fully corrected by lithography scanners. Therefore these features can cause localized defocus and overlay errors, and ultimately lower the yield. A special type of quantification methodology for localized geometry characterization also called Localized Feature Metrics (LFM) has been recently developed by KLA-Tencor. This methodology is effective in detecting and quantifying several types of yield limiting features on wafer surfaces. Prior methodologies of NT characterization are optimized for full wafer characterization, and are limited in accurately capturing and quantifying localized regions of interest. LFM is described in U.S. patent application Ser. No. 12/986,176 by Haiguang Chen et al. application Ser. No. 12/986,176 is hereby incorporated by reference in its entirety. Improvement of accuracy and sensitivity of LFM measurements and analysis is important for advanced nanotopography applications.

SUMMARY

Disclosed herein is a dimensional metrology system and method for enhanced and expanded LFM measurement. Objects of interest are classified according to user-defined parameters, and this enables enhanced feature contrast and more accurate feature detection, as well as more accurately defined feature object regions and feature metrics. This is facilitated by employing various special filtering schemes, such as Double Gaussian filtering, DOG (Difference of Gaussian) filtering, or line enhancement filtering by way of example, according to the feature type.

DETAILED DESCRIPTION

Figure 1A:
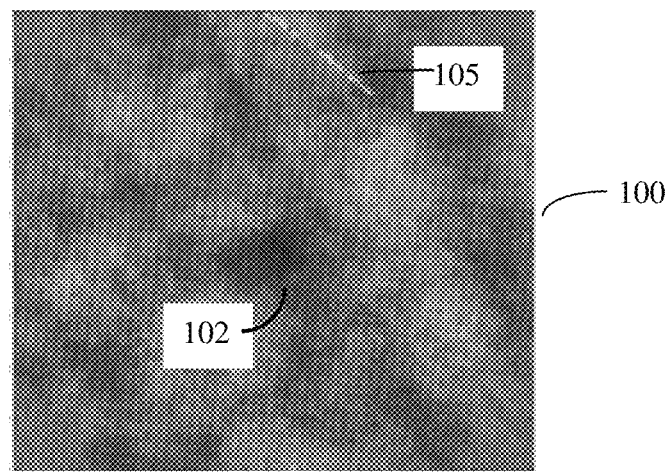
FIG. 1a shows an image region containing a dimple feature and a scratch feature.
Figure 1B:
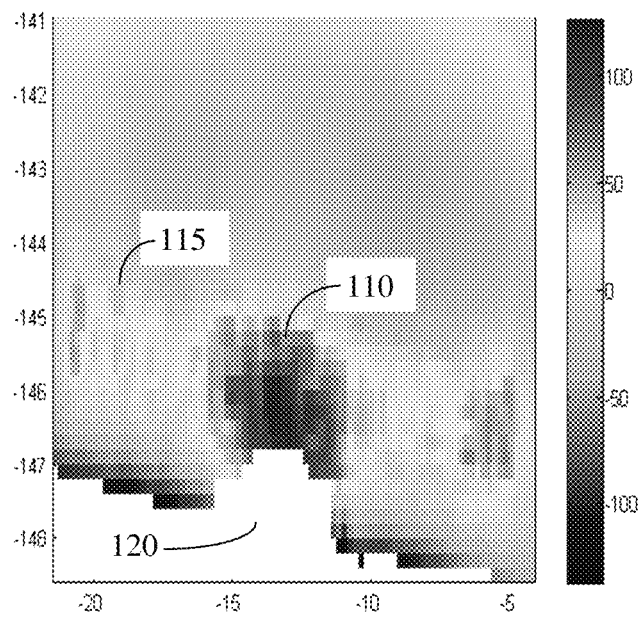
FIG. 1b shows an image region containing a laser mark feature.

As described in previously incorporated U.S. patent application Ser. No. 12/986,176 by Haiguang Chen et al, in Localized Feature Metrics (LFM), the user defines measurement regions for the features of interest and then calculates the maximum and minimum values within the image patches defined by these regions. The metric values obtained from these regular regions can be affected if other features occur in the defined region. Examples of this are shown in FIGS. 1a and 1b. In FIG. 1a, the image region contains the dimple 100 signal which the user is trying to quantify. However, the reported metric values are influenced by the signal from another surface feature, scratch line 105 in the image region, and this will generate incorrect indication of the amplitude of the dimple. Another example, illustrated in FIG. 1b, shows that accurate measurement of surface bump 110 on laser mark 115 is difficult using the maximum and minimum values from the whole image region. Three feature components are present in this region: scribe mark or laser mark 115; edge roll off effects near the wafer edge region; and laser mark bump 110. The object based concept described herein helps to separate the contributions from these three components in order to accurately quantify the feature of interest.

The present invention enhances the performance of LFM by, in addition to site based metrics, implementing the calculation of object-based metrics of features of interest, to provide more accurate feature-relevant information.

An aspect of the present invention is feature detection and classification of feature type according to such parameters as feature size, feature polarity, and feature geometric shape and distribution. Once the detection and classification has been performed, each feature type is associated with a corresponding, automatically defined feature object region. The feature information can be effectively utilized in the preprocessing stages to enhance the feature/background contrast and help the accurate detection of the features even in low signal-to-noise environments. As a result, much more sensitive and accurate measurements of the features can be produced, and the measurements obtained are more relevant to the features of interest and thus can provide more valuable information for the process monitoring. Disclosed herein are two specific exemplary applications of the object based metrology method: EPI pins, and laser mark bumps. Automatic detection of these features has been achieved, as well as quantification with high sensitivity and accuracy. The method is also applicable to many other feature types of interest in semiconductor production, such as: dimples, scratches, sliplines and dopant striation, edge crowns (near edge features due to epitaxial growth). Note that this list is exemplary and not limiting.

Prior methods utilize user define wafer regions which have limited regular shapes such as rectangular or disk shaped regions. When using these fixed measurement regions for the features of interest, the measurements obtained can be affected by other surface features in the region which have no relevance to the feature of interest, and often affect the sensitivity and accuracy of the measurement of the feature of interest. In addition, the selection of the measurement region position and size require manual optimization for different feature types.

In an embodiment of the present invention, various types of commonly seen features are defined according to their salient characteristics. A library of feature types and the corresponding characteristics thereof is maintained, and called up when a feature characterization is required. A library of filtering algorithms, each being optimized to a particular feature type, is also maintained. Once the feature has been identified, the optimal filtering algorithm for that feature type is implemented. By way of example, DOG (Difference of Gaussian) or LOG (Laplace of Gaussian) band-pass filters can be designed to match the characteristics of EPI pin features and to enhance their contrast. Line enhancement filters can be employed to improve the detection sensitivity of scratch and slipline features. Transform domain periodic filtering can be utilized to suppress non-periodic features for more robust detection of edge crown features.

Figure 2:
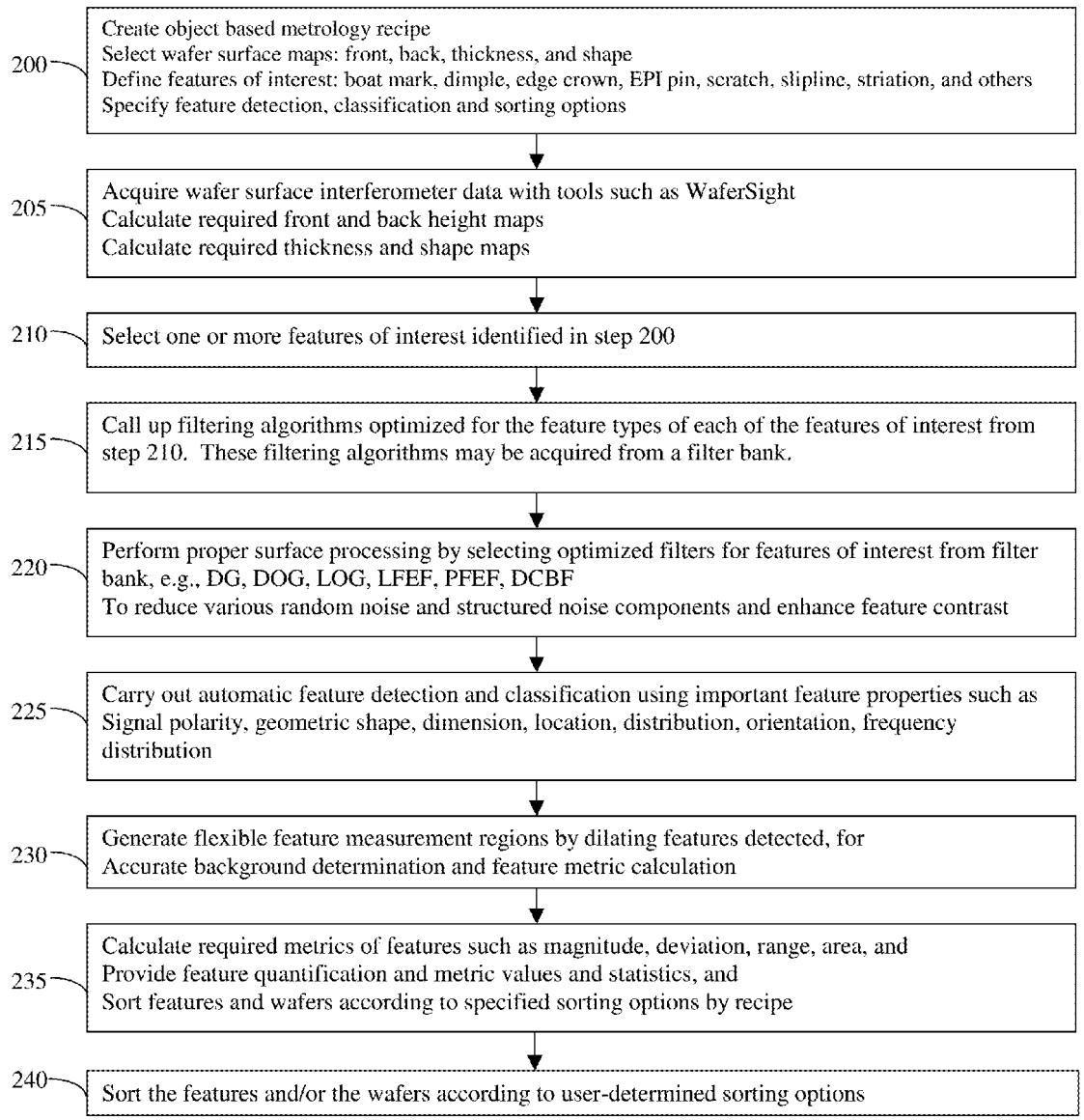
FIG. 2 is a high level process flow diagram of an embodiment of the inventive method.

FIG. 2 is a high level process flow diagram of an embodiment of the inventive method.

In step 200, create an object-based metrology recipe, including: selecting wafer surface maps, which may include front, back, thickness and shape maps; defining the features of interest, which may include such features as boat marks, dimples, edge crowns, EPI pins, scratches, sliplines, and striations (this list is exemplary and not restrictive); and specifying feature detection, classification, and sorting options. Note that defining characteristics for features of interest may be retrieved from a library. Table 1 below shows the major properties of several common feature types.

In step 205, acquire wafer surface interferometer data using a dual Fizeau interferometer tool such as WaferSight 2 (manufactured by KLA-Tencor and described in K Freischlad, S. Tang, and J. Grenfell, "*Interferometry for wafer dimensional metrology*", Proceedings of SPIE, 6672, 1 (2007)). From the surface interferometer data, calculate any required front and back surface height maps, as well as any required thickness and shape maps. High resolution (i.e., equal to or higher than 0.2 mm resolution pixel size) is needed for better detection and quantification. Note that a filtering operation can be performed to correct for wafer shape characteristics to remove lower frequency components of the wafer and enhance the feature, for example connecting broken lime segments in the scratch case.

In step 210, select one or more features of interest identified in step 200.

In step 215, call up filtering algorithms optimized for the feature types of each of the features of interest from step 210. These filtering algorithms may be acquired from a filter bank.

In step 220, perform proper surface processing to the surface maps of step 205, by selecting and implementing optimized filtering as in step 215. The optimized filtering applied to each type of feature of interest will serve to reduce both random noise and structured noise components, and will accordingly enhance feature contrast. The resulting surface map or maps for each type of feature of interest will be termed the object-oriented filtered surface map(s). The filtering process can be user-determined. In some cases, a single type of filtering applicable to multiple feature types can be used, then the particular features are searched for according to their properties. For example, a line enhancement filter can be used to process the input surface map to enhance the line structures and suppress random noise and non-linear structures. Then the various line structures such as scratch, slipline, and boat mark can be searched for in the processed map. Alternatively, the filtering process can consist of many processing stages. The configuration of the filtering schemes is flexible and can be optimized according to detection sensitivity, metric stability, and computation cost. Examples of types of filtering that may be used include but are not limited to: DG (Double Gaussian), DOG (Difference of Gaussian), LOG (Laplacian of Gaussian), LFEF (Line Feature Enhancement Filter), PFEF (Period Feature Enhancement Filter), DCBF (Discrete Cosine Based Filter).

In step 225, perform automatic feature detection and classification on the object-oriented filtered surface map(s). The features are detected based on the defining characteristics as described above, which are seen in feature signal properties such as signal intensity, signal polarity, feature dimension, feature shape, feature distribution, orientation, and frequency distribution information.

In step 230, define feature object regions, which can have irregular shapes in general, and provide more localized and more accurate definition of the feature object boundary. The boundaries for the features of interest are determined according to boundary threshold definitions in the algorithms. These boundary threshold definitions may be user defined. An example of a boundary definition might be a user-defined percentage of the maximum intensity. Note also that the feature object measurement regions can be made flexible by dilating or enlarging features detected, to optimize background determination and feature metric calculation.

In step 235, calculate the required metrics of the features as identified and located in feature object regions, according to step 230. Note that once the feature object regions are determined, the metrics may be calculated in various ways, including those described in U.S. patent application Ser. No. 12/778,013. Having accurately defined the feature object regions, the required metrics (such as magnitude, deviation, range, and area, as well as statistics of the grouped objects) can be more reliably and more accurately calculated. The resulting metrics will depend only on the feature objects of interest, assuming that other features do not cross the identified feature object regions.

Figure 8A:
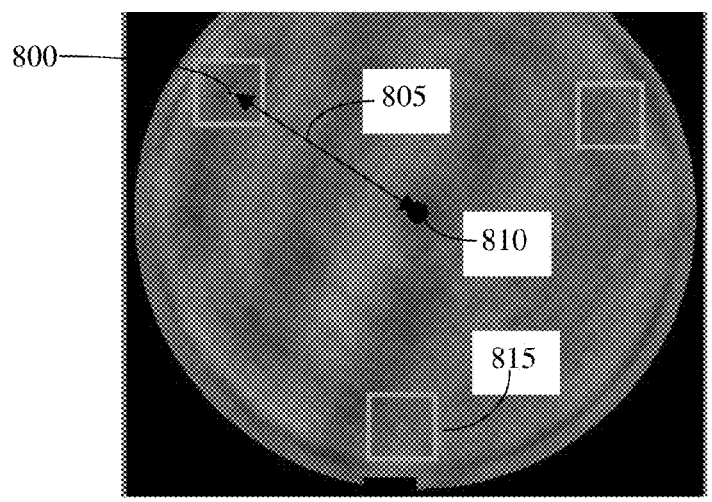
FIG. 8a shows three EPI pin support positions.
Figure 8B:
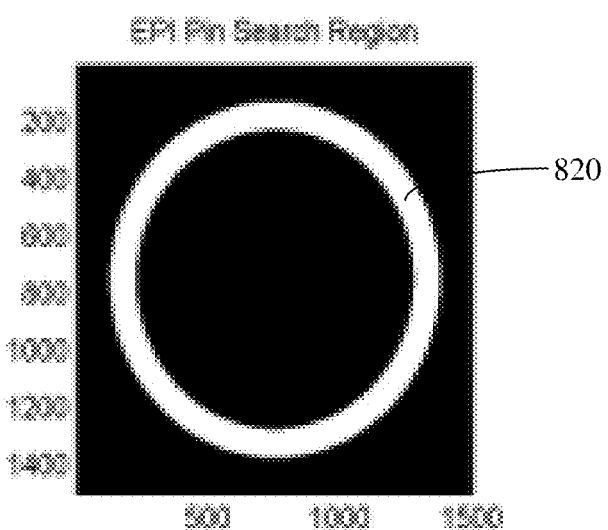
FIG. 8b shows an EPI pin feature search region.

In step 240, sort the features and/or the wafers according to user-determined sorting options.

during the EPI process, the EPI pin defects can appear at any orientation on the wafer, even though they still have the same radius 805. In this case, the feature search region 820 is defined as an annulus with EPI pin radius 805. This case is illustrated in FIG. 8b.

According to earlier described steps 220 and 225, for EPI pin detection, the type of object-oriented filtering is Difference of Gaussian (DOG) filtering. The DOG filter, used to first preprocess the acquired wafer surface maps for EPI pin detection, is designed to provide band-pass filtering matched to the frequency response of a typical EPI pin signal. Using the DOG filter, the image background and high frequency noise components can be effectively removed, thereby enhancing the EPI pin contrast. DOG filtering is described in http://en.wikipedia.org/wiki/Difference_of_Gaussians Candidate defects are next detected based on their signal amplitude and size. According to earlier described step 230, the EPI pin defects are then selected by optimizing the best EPI pin configuration, using data about the defect sizes, defect amplitudes, and defect positions. Since information about EPI pin signals is well characterized, this information has been used

TABLE 1

Several Common Features and Their Major Properties

| | Dimple | Bump | Scratch | Slip-line | Near Edge Features | EPI Pin | LM Bump |
|---|---|---|---|---|---|---|---|
| Polarity | Negative | Positive | Bipolar, more negative | Bipolar | Bipolar | Bipolar | Positive |
| Location | Random | Random | Random | Wafer edge region | Wafer edge region, fixed similar radius | Fixed similar radius on wafer | Laser mark region |
| Orientation | No | No | Any orientation and low angular curvature shaped | Fixed (90 or 60 degrees) angles and straight line shaped | Equal angular separation | Equal angular separation | Along the laser mark |
| Other Signal Properties | Random shape and size | Random shape and size | Often sparsely located | Often densely located | Often round and volcano shaped | Often round and volcano shaped | Size bigger than LM letters |

Figure 3:
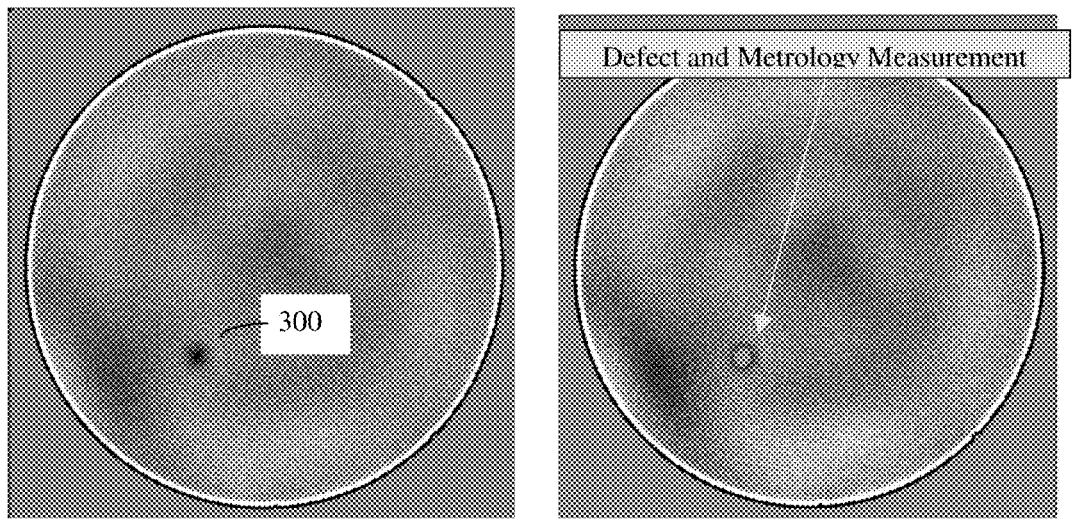
FIG. 3 shows a large dimple in a shape corrected surface map.

Examples of some of the above-mentioned feature types are shown in the figures:

FIG. 3 shows a large dimple 300 in a shape corrected surface map.

Figure 4:
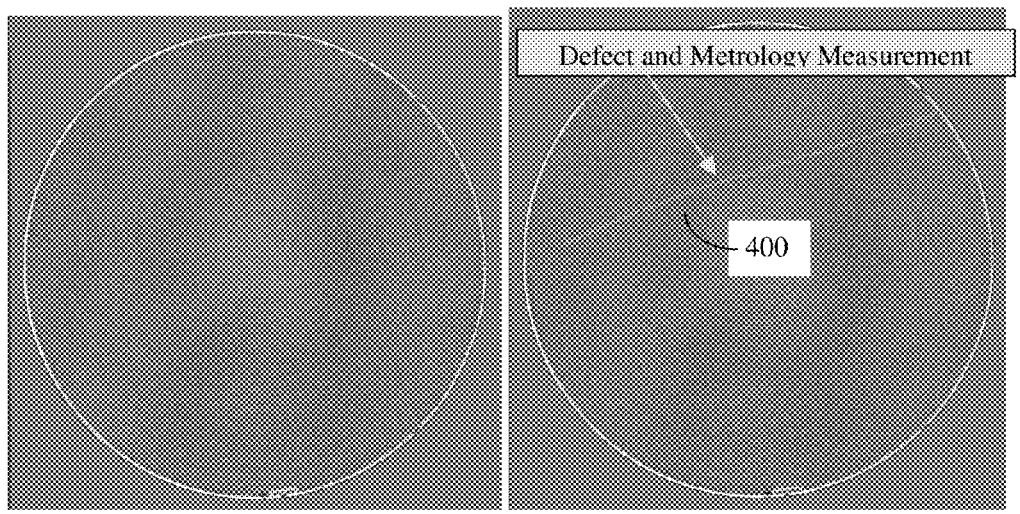
FIG. 4 shows a scratch in a shape corrected surface map.

FIG. 4 shows scratch 400 in a shape corrected surface map.

Figure 5:
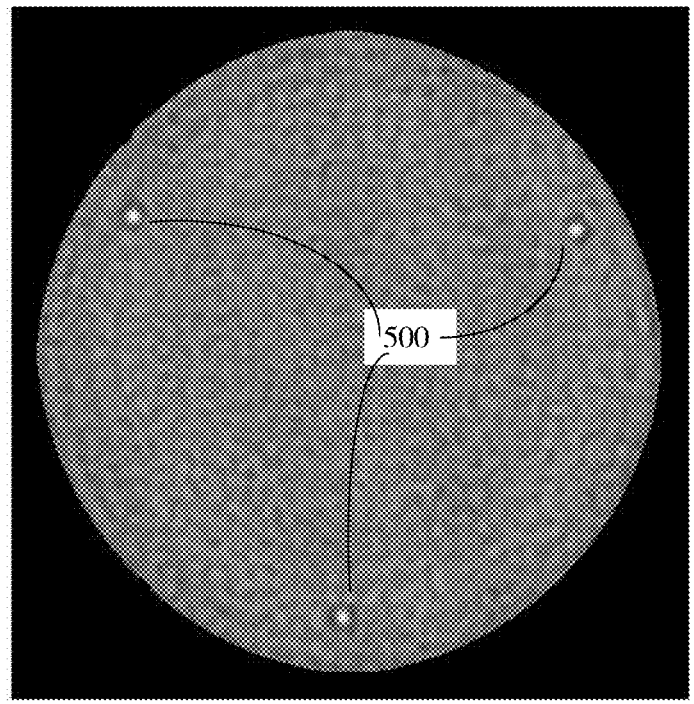
FIG. 5 shows EPI pin defects in a shape corrected surface map.

FIG. 5 shows EPI pin defects 500 in a shape corrected surface map.

Figure 6:
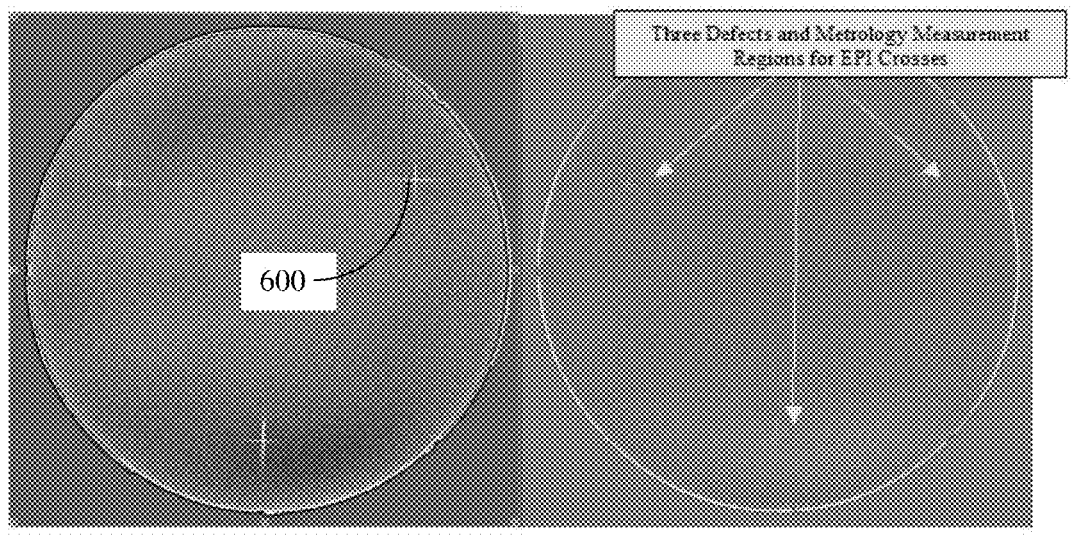
FIG. 6 shows an EPI pin cross and a scratch in a shape corrected surface map.

FIG. 6 shows EPI pin cross 600 in a shape corrected surface map.

Figure 7:
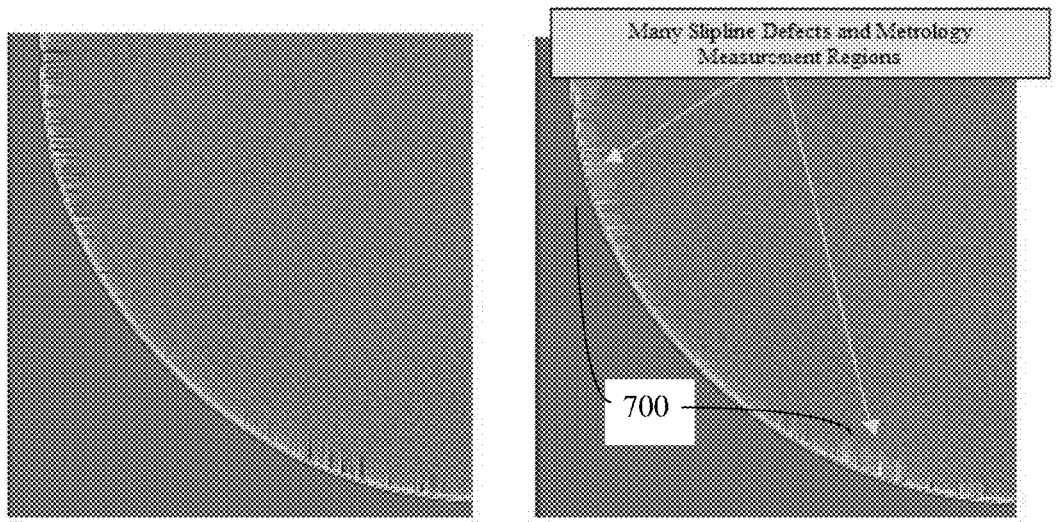
FIG. 7 shows wafer edge sliplines in a shape corrected surface map.

FIG. 7 shows wafer edge sliplines 700 in a shape corrected surface map.

An embodiment of the method of the present invention will be illustrated in more detail using two example features: 1) EPI pins, and 2) laser mark bump detection.

EPI Pin Defects

Figure 9A:
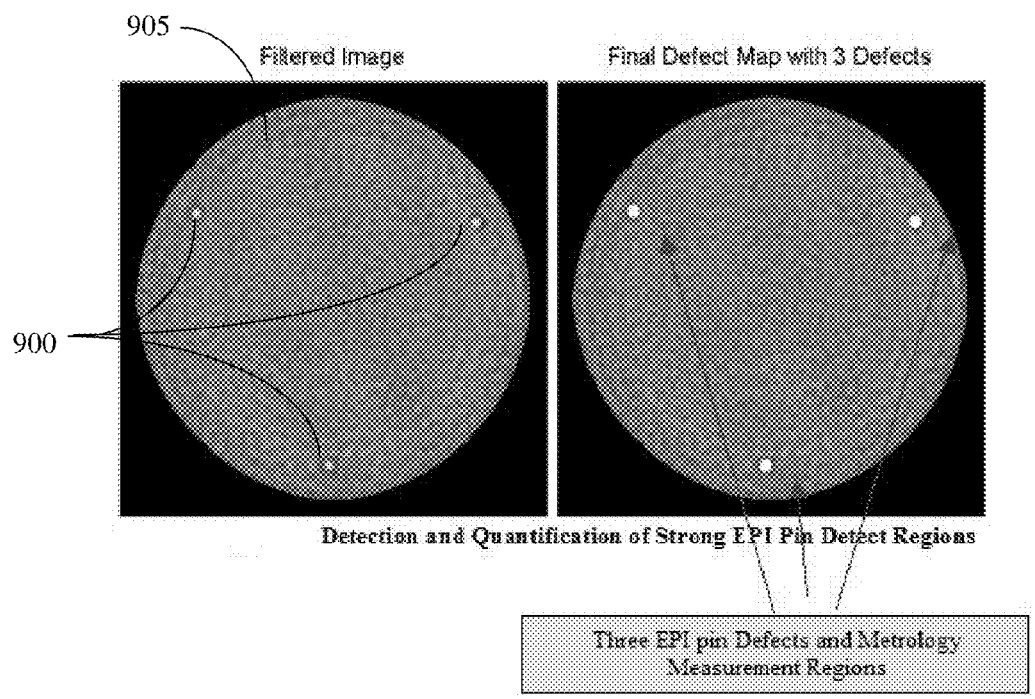
FIG. 9a shows detection of strong EPI pin regions in a filtered image.
Figure 9B:
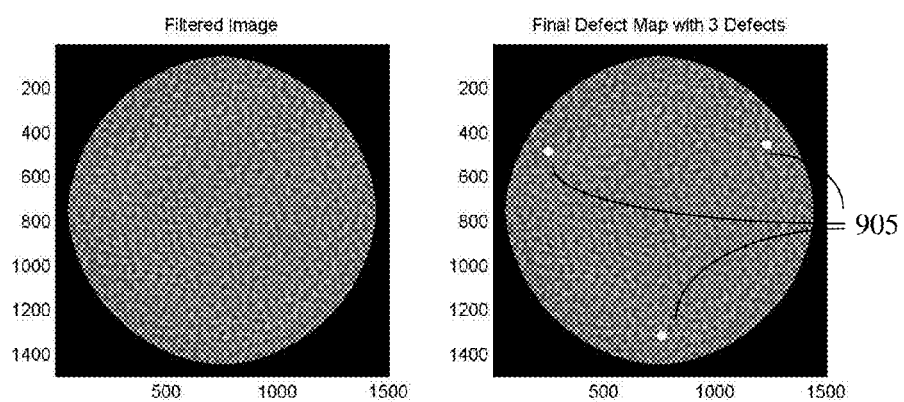
FIG. 9b illustrates detection and quantification of weak EPI pin regions.

As a first example of the application of the object based feature metric calculation method, EPI pins on a wafer surface have been accurately detected and quantified. EPI pin defects are formed on a wafer surface during an epitaxial deposition process. These defects are located at three EPI pin support positions 800, as illustrated in FIG. 8a. In general, the three EPI pin support positions have the same radius 805 from wafer center 810, and are separated by 120 degrees. If the EPI pin positions are known, three measurement regions 815 can be defined. However, if the wafers are not notch aligned to obtain good detection sensitivity and low rates of false positives. FIG. 9a shows detection of strong EPI pin regions 900 in filtered image 905. Next, as in step 235, the object regions of EPI pin regions 900 are accurately defined. The region may be rectangular or disk shaped, and is centered at the defect centroids. Finally, as in step 240, the metric values for EPI pin regions 900 are calculated based on the defined object feature regions, with interference from other surface features in the neighboring regions. FIG. 9b illustrates detection and quantification of weak EPI pin regions 905.

Figure 10A:
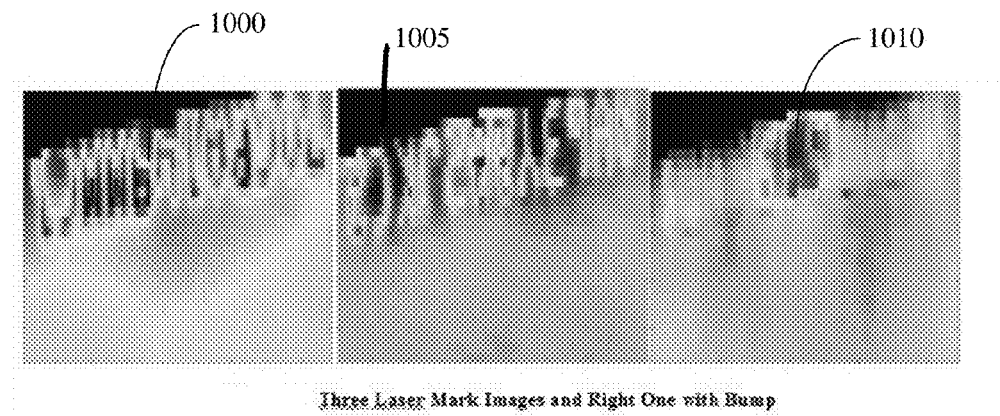
FIG. 10a illustrates the challenges in laser mark bump detection and quantification.

As a second example of the application of the object based feature metric calculation method, laser mark bumps on a wafer surface have been accurately detected and quantified. FIG. 10a illustrates the challenges in laser mark bump detection and quantification. The laser mark regions yield large signal variations from laser mark characters 1000 and sharp transitions at wafer edge 1005. These are in close proximity to laser mark bump 1010, which makes the accurate and reliable quantification of laser mark bump 1010 more challenging than for many other surface features located in the wafer interior regions.

Figure 10B:
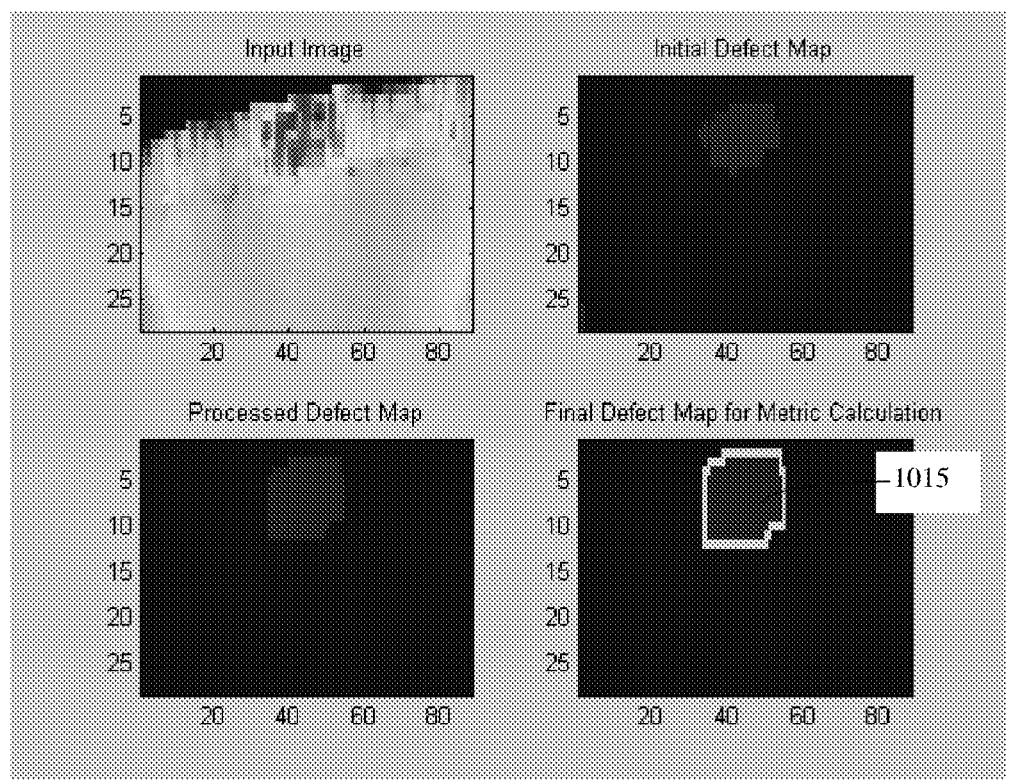
FIG. 10b illustrates an object feature region for a laser mark bump.

Using the object based metrology method as outlined above, laser mark bump 1010 can be identified automatically, using the object size, signal intensity, and polarity. In the laser mark bump case, low order surface fitting as used in LFM is utilized to remove surface shape components and to preserve the low frequency components of the laser mark bump. The bump feature object is detected according to the signal amplitude, area, and frequency. A morphological closing operation can be used to fill any small observed holes in the object, and then a morphological dilation operation is used to form the object region boundary. The corresponding object feature region 1015 is defined, as shown in FIG. 10b. The features from the laser mark characters 1000 will not be reported as laser mark bumps. Then the amplitude of the laser mark bump and its size can be calculated to provide more relevant bump information for process development and control. In this example, only the object size, signal intensity and polarity are used to identify the object. In the more general case, other information such as object location and geometric shape can be used to perform more extended analysis and help with accurate object identification and metrology measurement.

Figure 11:
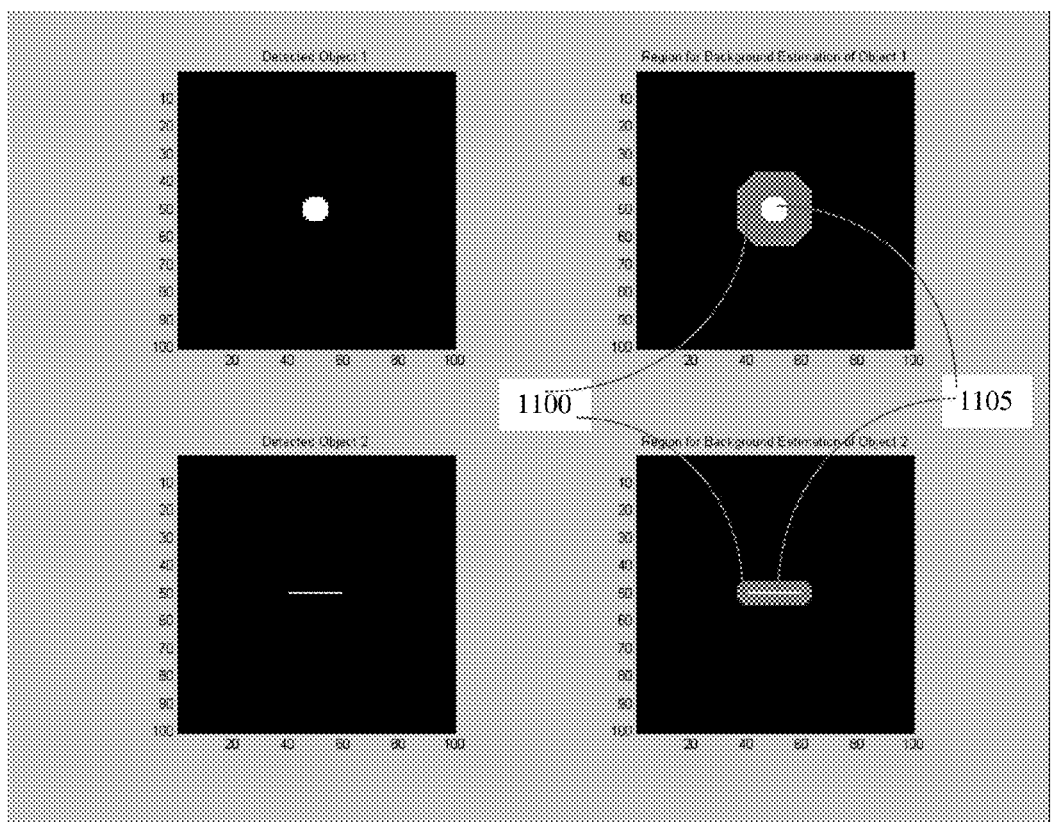
FIG. 11 illustrates the automatic defining of object based measurement regions.

FIG. 11 illustrates the defining of object based measurement regions. The object measurement region is the region in the "viewfinder", i.e., the region detected and measured when a feature within the measurement region is being measured and quantified. The feature object region is composed of the feature object pixels which meet the feature property definitions. The object measurement region is created by dilating the object pixel for the local background level estimation. As a result, the object region is always inside of the object measurement region. The shape and area of the object measurement region is determined by the feature object shape and the dilation operation performed on it.

Since the object is identified first, more accurate measurement regions can be defined, with flexible shapes depending on the feature shape. One possible definition of the measurement regions 1100, shown in FIG. 11, is to automatically dilate feature objects 1105. An advantage of this is for improvement of neighborhood background level determination. The detected object pixels in the measurement region can be excluded from the calculations of shape correction and background level estimation, yielding more accurate feature metric results, since the calculation of the feature metric values is based partially on the local background level.

System Considerations

Figure 12:
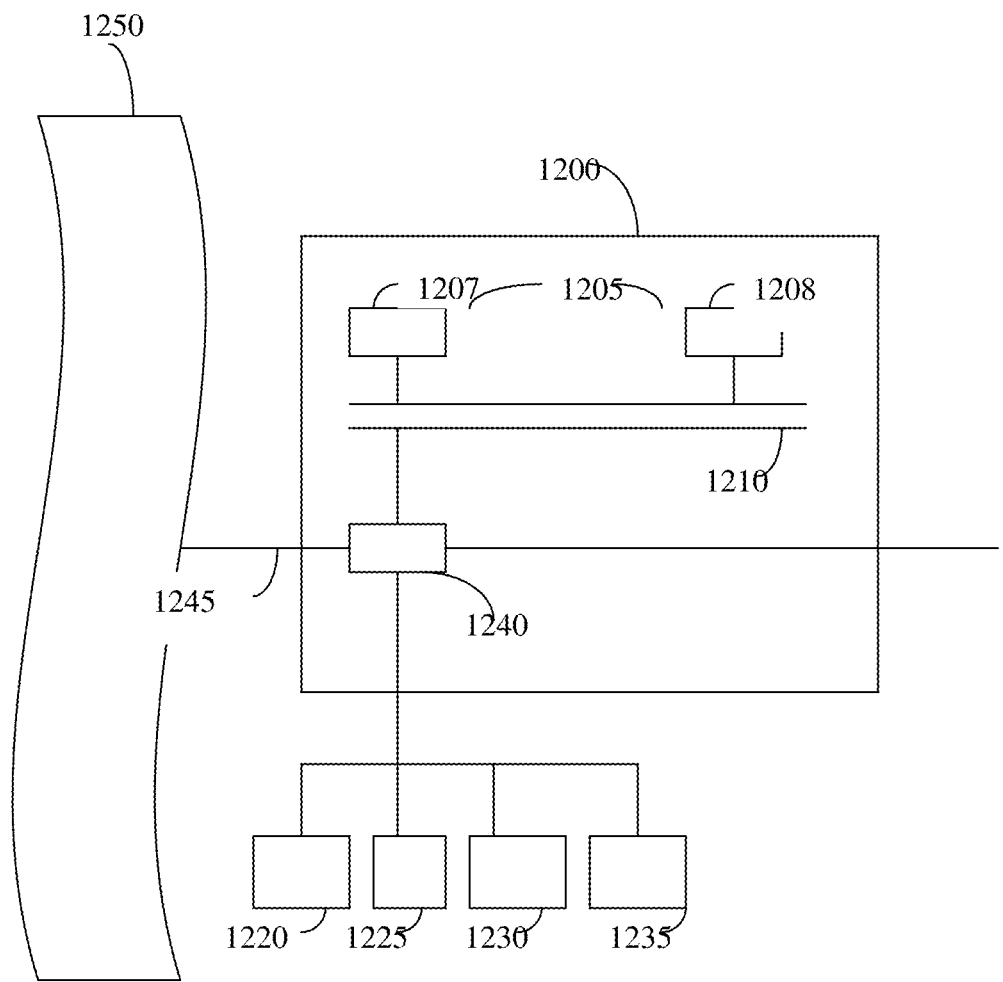
FIG. 12 illustrates an exemplary computer system which may be used to implement the inventive method.

The inventive methods or portions thereof may be computer-implemented. The computer system, illustrated in FIG. 12, may include a processor 1200 (e.g. a processor core, a microprocessor, a computing device, etc), memory 1205 which may include a main memory 1207 and a static memory 1208, which communicate with each other via a bus 1210. The machine may further include a display unit 1215 that may comprise a touch-screen, or a liquid crystal display (LCD), or a light emitting diode (LED) display, or a cathode ray tube (CRT). As shown, the computer system also may include a human input/output (I/O) device 1220 (e.g. a keyboard, an alphanumeric keypad, etc), a pointing device 1225 (e.g. a mouse, a touch screen, etc), a drive unit 1230 (e.g. a disk drive unit, a CD/DVD drive, a tangible computer readable removable media drive, an SSD storage device, etc), a signal generation device 1235 (e.g. a speaker, an audio output, etc), and a network interface device 1240 (e.g. an Ethernet interface, a wired network interface, a wireless network interface, a propagated signal interface, etc).

The drive unit 1230 may include a machine-readable medium on which is stored a set of instructions (i.e. software, firmware, middleware, etc) embodying any one, or all, of the methodologies described above. The set of instructions is also shown to reside, completely or at least partially, within the main memory 1207 and/or within the processor 1200. The set of instructions may further be transmitted or received via the network interface device 1240 over the network bus 1245 to network 1250.

It is to be understood that embodiments of this invention may be used as, or to support, a set of instructions executed upon some form of processing core (such as the CPU of a computer) or otherwise implemented or realized upon or within a machine- or computer-readable medium. A machine-readable medium includes any mechanism for storing or transmitting information in a form readable by a machine (e.g. a computer). For example, a machine-readable medium includes read-only memory (ROM); random access memory (RAM); magnetic disk storage media; optical storage media; flash memory devices; electrical, optical, acoustical or other form of propagated signals (e.g. carrier waves, infrared signals, digital signals, etc); or any other type of media suitable for storing or transmitting information.

By way of example, this invention has been implemented using Matlab in one LFM package and has been implemented using C++ for one metrology tool. Note that it can also be implemented using other programming languages and in other surface metrology tools and systems.

The method and system disclosed herein provides for automatic detection and quantification of important surface features on a dimensional metrology tool.

The object based metric methods disclosed herein can by applied to many other types of features, when their properties can be used to accurately identify them and define the measurement regions, as exemplified in Table 1. These features can be utilized to provide optimized data processing, and to \ obtain accurate and stable feature detection and quantifications. For example, for scratch and slip-line features, algorithms specifically designed to connect the broken line segments and to enhance line contrast may be used to process the surface images. Edge crown signals can be effectively enhanced by using the angular periodic distribution of these edge crown features in polar image space and in the transformed frequency domain, where the signal components are aligned and enhanced, and non-periodic surface features are suppressed.

From the automatically defined measurement regions, in addition to the conventional surface metric values based on pixel values, such as maximum value, minimum value, and the corresponding pixel positions, other useful measurement information can also be calculated. For example, object shape, object size, object texture, object spatial distribution and object relationship may be calculated, which will provide more useful information, such as for process monitoring and development by WaferSight tools.

It is not expected that the present invention be limited to the exact embodiments disclosed herein. Those skilled in the art will recognize that changes or modifications may be made without departing from the inventive concept. The scope of the invention should be construed in view of the claims.

With this in mind, we claim:

1. A computer-implemented method for automatic detection and quantification of important features on a surface of a semiconductor wafer by a dimensional metrology tool comprising the steps of:
specifying user defined at least one feature type of interest;
generating a list of feature attributes for each said at least one feature type of interest;
acquiring wafer interferometer data measuring said surface of said semiconductor wafer including surface height measurement data, using said dimensional metrology tool;

calculating from said wafer interferometer data surface maps of said wafer, wherein said surface maps of said wafer include at least one of: front and back surface height maps, thickness map, and shape map;

using said wafer surface maps to automatically detect and classify features of said at least one feature type of interest according to said list of feature attributes;

automatically defining feature object regions bounding said features according to said detecting and classifying of said features, wherein said feature object region includes feature object region pixels;

defining an object based measurement region around each said feature; and calculating with a computer user defined measurement metrics of said features as located in said feature object regions.

2. The method of claim 1, wherein contrast and definition of said features is enhanced.

3. The method of claim 1, wherein said acquiring of wafer interferometer data uses a dual-interferometer tool.

4. The method of claim 1, further including the step of processing said surface maps of said wafer to enhance feature contrast of each said feature type of interest, utilizing at least one filtering algorithm wherein each said feature type of interest is associated with a filtering algorithm optimized to said feature type.

5. The method of claim 1, wherein the step of defining an object based measurement region around each said feature comprises dilating each said feature object region.

6. The method of claim 5, further including the step of estimating a background level of each said measurement region with said feature object region pixels excluded.

7. The method of claim 1, further including the step of estimating a background level of each said measurement region with said feature object region pixels excluded.

8. The method of claim 1, further including the step of sorting the detected features and the wafers according to the specified feature types.

9. A system for automatic detection and quantification of important features on a surface of a semiconductor wafer by a dimensional metrology tool including:

means for mounting a semiconductor wafer;

an interferometer adapted to provide wafer interferometer data measuring a surface of said semiconductor wafer including surface height measurement data; and a computer configured to:
  specify user defined at least one feature type of interest;
  generate a list of feature attributes for each said at least one feature type of interest;
  calculate wafer surface maps from said wafer interferometer data;
  use said wafer surface maps to automatically detect and classify features of said at least one feature type of interest according to said list of feature attributes;
  automatically define feature object regions bounding said features according to said detecting and classifying of said features, wherein said feature object regions include feature object region pixels;
  define an object based measurement region around each said feature; and
  calculate user defined measurement metrics of said features as located in said feature object regions.

10. The system of claim 9, wherein said computer is further configured to calculate from said wafer interferometer data surface maps of said wafer including front and back surface height maps, thickness map, and shape map.

11. The system of claim 10, wherein said computer is further configured to process said surface maps of said wafer to enhance feature contrast of each said feature type of interest, utilizing at least one filtering algorithm wherein each said feature type of interest is associated with a filtering algorithm optimized to said feature type.

12. The system of claim 9, wherein said computer is further configured to estimate a background level of each said measurement region with said feature object region pixels excluded.

13. The system of claim 9, wherein said computer is further configured to sorts the detected features and the wafers according to the specified feature types.

* * * * *